(12) United States Patent
Domke et al.

(10) Patent No.: US 7,332,444 B2
(45) Date of Patent: Feb. 19, 2008

(54) METHOD FOR SMOOTHING AREAS IN STRUCTURES BY UTILIZING THE SURFACE TENSION

(75) Inventors: Wolf-Dieter Domke, Adelsdorf (DE); Siegfried Schwarzl, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 30 days.

(21) Appl. No.: 11/064,528

(22) Filed: Feb. 22, 2005

(65) Prior Publication Data

US 2005/0214467 A1    Sep. 29, 2005

(30) Foreign Application Priority Data

Feb. 23, 2004    (DE) .................. 10 2004 008 782

(51) Int. Cl.
*H01L 21/469* (2006.01)
*H01L 21/31* (2006.01)

(52) U.S. Cl. .................. 438/780; 257/E21.026; 430/124.13; 438/781

(58) Field of Classification Search ................. 438/707, 438/795, 708, 780, 781; 430/330, 324, 322, 430/313, 124.13; 257/E21.026
See application file for complete search history.

(56) References Cited

U.S. PATENT DOCUMENTS

| | | | |
|---|---|---|---|
| 6,582,891 B1 * | 6/2003 | Hallock et al. | 430/330 |
| 6,730,458 B1 * | 5/2004 | Kim et al. | 430/296 |
| 2002/0168594 A1 | 11/2002 | Lin et al. | |
| 2003/0027080 A1 | 2/2003 | Lu | |
| 2003/0082486 A1 | 5/2003 | Endo et al. | |
| 2004/0053511 A1 * | 3/2004 | Chandhok et al. | 438/780 |
| 2005/0084807 A1 * | 4/2005 | Meagley et al. | 430/464 |

FOREIGN PATENT DOCUMENTS

| | | |
|---|---|---|
| WO | WO-02/41080 A2 | 5/2002 |
| WO | WO-2005/038884 A2 | 4/2005 |

OTHER PUBLICATIONS

Falbe et al, Rompp Chemie Lexikon, Georg Thieme Verlag, vol. 6, 9th expanded and revised edition, Stuttgart, Germany (1995).

* cited by examiner

*Primary Examiner*—Asok Kumar Sarkar
(74) *Attorney, Agent, or Firm*—Dickstein Shapiro LLP

(57) ABSTRACT

A method for smoothing areas of a structure made of a first material having a predetermined first glass transition temperature on a carrier includes the steps of: (1) applying a second material having a predetermined second glass transition temperature, so that the surface of the structure of the first material is at least partially covered by the second material; (2) increasing the temperature of the first material to a first predeterminable temperature, which is greater than the first glass transition temperature; and (3) lowering the temperature of the first material below the first glass transition temperature of the first material.

26 Claims, 3 Drawing Sheets

FIG 3C

METHOD FOR SMOOTHING AREAS IN STRUCTURES BY UTILIZING THE SURFACE TENSION

CROSS-REFERENCE TO RELATED APPLICATION

The present application claims priority to German Patent Application Serial No. 10 2004 008 782.2, filed Feb. 23, 2004, which is hereby incorporated by reference in its entirety.

TECHNICAL FIELD

The present invention relates to a method for smoothing areas of a structure and more particularly, relates to a method for the reduction of edge roughness of the structure.

BACKGROUND

Miniaturization in microelectronics will continue to progress rapidly in accordance with the International Technology Roadmap for Semiconductors (ITRS). According to this, in 2010 and 2016, 45 nm and 22 nm lines are respectively expected for DRAMs and values of 25 nm and 13 nm are respectively expected for the geometrical gate lengths of microprocessors (MPU).

For the mass production of structures with a size of 45 nm or less, optical lithography in the soft X-ray range at 13.5 nm, so-called extreme ultraviolet lithography (EUV lithography), is rated as the most promising lithography technology. However, it will only be used when not only the required resolution but also the required linewidth fluctuations are complied with, which are generally less than 10% of the minimum line widths, i.e. in 2010 approximately 4 nin for DRAMs and approximately 2 nm for MPU gate lengths. For 2016, the corresponding values will even be 2 nm and 1 nm, respectively. The edge roughness of the resist structures is therefore permitted to exceed scarcely half of these values per side. Only edge roughnesses of approximately 6 to 10 nm are currently being achieved, however, which is inadequate even for the 50 nm node in 2009.

A series of causes contribute to the edge roughness of resist structures that are produced lithographically. In some instances, work on measures for minimizing the edge roughness is already being carried out very successfully.

Thus, by way of example, high resolution electron beam writing and anisotropic etching processes are being used in attempts to transfer the resist structures to the mask blank as dimensionally faithfully as possible in order to minimize the linewidth fluctuations or the edge roughness on the mask.

Furthermore, the imaging performance of the projection optical system is being optimized, by way of example, in particular increasing the resolution, reduction of wavefront errors, reduction of light scattering (flare), exact function of the scanning tables for mask and wafer and also minimization of aberrations.

Furthermore, use is made of photoresists (resists) which make the least possible contribution to the edge roughness, e.g. by using basic polymers with different types of linear or ring-type molecular elements that are as small as possible, and minimizing the diffusion lengths of the photochemically generated protons, e.g. by the addition of bases.

However, a photoresist is intended to have a high sensitivity for large throughput and a high contrast, but experience shows that this can be achieved only at the expense of higher edge roughness.

As set forth above, ever smaller structures will be required in the future in order to further improve microelectronics. Since, in the case of ever smaller structures, low edge roughness of these structures is of enormous importance, there is a perceived need for a method for producing structures with the least possible edge roughness.

SUMMARY

The present invention accomplishes this and provides for a method for smoothing structures and for producing structures with the least possible edge roughness.

One aspect of the present invention provides a method for smoothing areas of a structure made of a first material having a predetermined first glass transition temperature on a carrier. The method includes the following steps:

applying a second material having a predetermined second glass transition temperature, so that the surface of the structure of the first material is at least partially covered by the second material;

increasing the temperature of the first material to a first predeterminable temperature, which is greater than the first glass transition temperature; and lowering the temperature of the first material below the first glass transition temperature of the first material.

The method according to the invention permits a reduction of the edge roughness of structures that have already been produced. In this case, it is possible for the structures to have been produced lithographically, for example, utilizing all measures known from the prior art, in which case the edge roughness can already be kept down during production.

By way of example, a structure may comprise a lithographically produced photoresist mask or structure, as are conventionally used in semiconductor technology. Such a structure preferably includes a multiplicity of essentially parallelepipedal elements which may be produced e.g. from a polymer.

The method according to the invention exploits the property that every surface strives for a minimum surface energy. Consequently, the method according to the invention is based on the inherent surface tension of the materials used.

If the temperature of the structure of the first material is increased to a predetermined or predeterminable first temperature, which is greater than its first glass transition temperature, the molecular chains of the polymer become mobile and strive for a coiled form. They are then elastically to plastically deformable. Since the surface tension is determined by the numerical ratio of surface molecules to molecules within the material, the efficacy of the proposed method increases with increasing miniaturization of the structure and will be the greatest precisely in the structure size range of 30 nm or smaller. It is known that the surface tension, which is a linear force (force per unit length), is predominant in this structure size range and outweighs the majority of other forces that are based on pressure (surface force) or mass (volume force). The forces acting on the surface of the first material as a result of the surface tension smooth the surface, i.e., the edge roughness is reduced.

The predetermined first temperature is understood, in the sense of the invention, to mean that this first temperature is already defined prior to the temperature increase.

If the temperature of the structure of the first material is increased above the first glass transition temperature thereof, not only is the surface thereof smoothed, i.e., the edge roughness reduced, rather the material strives for a state with minimum surface energy, i.e., a state with a minimum size of the surface. In the case of a parallelepipedal structure, therefore, a rounding of the structure would occur under the influence of the surface tension.

In order to prevent such an alteration of shape, in the present invention, before the temperature of the first material is increased, a second material having a predetermined second glass transition temperature is applied, so that the surface of the structure of the first material is at least partially covered by the second material.

In a particularly preferred embodiment, the preferably elastic or deformable second material just covers the structure of the first material. The structure has a maximum height above the carrier to which it is applied. Said maximum height is preferably measured in the direction of the normal to the preferably essentially planar carrier, i.e., the height is essentially measured in the perpendicular direction with respect to the essentially planar surface of the essentially planar carrier. The second material just covers the structure of the first material when a space lying above the structure or the carrier in the direction of the normal is filled with the second material up to the aforementioned maximum height or slightly above it, the height being measured from the essentially planar surface of the carrier. In other words, the second material just covers the structure when it is applied, measured from the surface of the carrier, up to a height which corresponds to the aforementioned maximum height or a slightly larger height.

If, then, the structure is at least partially covered with the second material and the temperature is increased above the first glass transition temperature, then a minimum surface is established in both materials as a result of the surface tension. In this case, the parallelepipedal shape of a structure can advantageously be preserved, only the edge roughnesses being reduced.

This is the case, in particular, if the distance between the area of the first material that is remote from the carrier and the area of the second material that is remote from the first material is as small as possible, in particular zero, in area regions above the structure. Since, in this case, the shape of the second material and, in particular, the shape of the area of the second material that is remote from the first material remains essentially unchanged and the adjoining area of the first material essentially assumes the same shape or curvature, the shape of said area of the first material remains essentially constant, but this area is smoothed, i.e., the edge roughnesses are reduced.

Consequently, the surface energies of the remaining areas of the preferably parallelepipedal structure are minimized, the shape of the remaining areas essentially being retained and these areas merely being smoothed, i.e. the edge roughnesses being reduced.

In this case, the temperature is increased only to an extent such that the structure loses neither its shape nor its dimensioning.

Preferably, after lowering the temperature, in particular after lowering the temperature below the glass transition temperature of the first material, the second material is removed.

In a further preferred embodiment of the invention, the second glass transition temperature of the second material is greater than the first glass transition temperature of the first material. In a particularly preferred embodiment, both glass transition temperatures may also be of identical magnitude.

In a further preferred embodiment, the first temperature to which the temperature of the first material is increased is preferably 5° C. to 40° C., in particular 10° C. to 20° C., greater than the first glass transition temperature of the first material. The first temperature is furthermore preferably less than or equal to the second glass transition temperature of the second material.

Preferably, aliphatic acrylate and/or methacrylate esters, polyether-modified acrylate/methacrylate esters, fluorine-modified acrylate/methacrylate esters, silane- or siloxane-modified acrylate/methacrylate esters, fluorine-, silane-, siloxane-, alkylether-modified acrylate/methacrylate ester maleic anhydride copolymers are used as first material and acrylate/methacrylate adamantyl esters, aromatic polyethers, aromatic polyesters, modified polyhydroxystyrenes, hydroxystyrene acrylate/methacrylate esters, acrylate/methacrylate maleic anhydride copolymers, norbornene maleic anhydride copolymers, polyaryl ether sulfones are used as second material. Preferably, for e.g. the material aliphatic acrylate/methacrylate esters the first glass transition temperature is approximately 80° C. to approximately 120° C. and the second glass transition temperature for the material acrylate/methacrylate maleic anhydride copolymers preferably is approximately 110° C. to approximately 150° C.

A further aspect of the present invention is to provide a method for smoothing areas of a structure made of a first material having a predetermined first glass transition temperature on a carrier, includes the following steps of:

applying a thin layer of a deformable separating material to the surface of the first material, so that the surface of the first material is at least partially covered by the separating material;

applying a second material having a predetermined second glass transition temperature, so that the surface of the separating material is at least partially covered by the second material;

increasing the temperature of the first material and the second material to a first predeterminable temperature, which is greater than both the first and the second glass transition temperature; and lowering the temperature of the first material and the second material below the first glass transition temperature of the first material.

In the case of this method, the separating material advantageously prevents a solid, i.e. sparingly soluble compound from being produced between the structure of the first material and the second material. This is advantageous particularly if the materials are in each case heated above their glass transition temperatures. The separating material preferably includes a thin layer above the structure of the first material. If the structure of the first material essentially has a parallelepipedal shape, by way of example, then the separating material may have a box shape, by way of example. In this case, areas of the separating material advantageously run essentially parallel to areas of the structure. If, then, the surface of the structure of the first material for example has an area that runs essentially parallel to the essentially planar carrier, the surface of the carrier material preferably also has an area that runs essentially parallel to the planar carrier.

In a particularly preferred embodiment of the invention, the second material just covers the separating material, where the word just here is preferably understood in the same way as described above. Consequently, on account of the second material, areas of the first material are smoothed analogously to the method described above, the fact that the separating material is deformable being exploited in this case.

The separating material is preferably aliphatic acrylate and/or methacrylate esters, polyether-modified acrylate/methacrylate esters, fluorine-modified acrylate/methacrylate esters, silane- or siloxane-modified acrylate/methacrylate esters, fluorine-, silane-, siloxane-, alkylether-modified acrylate/methacrylate ester maleic anhydride copolymers, furthermore long-chain siloxane compounds, silicone compounds, wax dispersions, phenolic resins, graphite-containing resins, vapor phase depositable silicon-containing or carbon-containing CVD layers, furthermore sputtering carbon layers.

Furthermore, the layer thickness of the separating material preferably lies between 5 nm and 15 nm, particularly preferably between 8 nm and 12 nm.

In a further preferred embodiment of the present invention, the second glass transition temperature of the second material is greater than or equal to the first glass transition temperature of the first material.

The second material and the first material are particularly preferably identical materials. What can advantageously be achieved in this case is that the temperature is increased above the glass transition temperature in both materials at the same point in time. Consequently, the transition to the glass state is achieved simultaneously in both materials and the smoothing of the areas, i.e. the reduction of the edge roughness, is simplified and the thermal loading of the first material is reduced.

The first glass transition temperature of the first material is preferably approximately 90° C. to approximately 130° C. and the second glass transition temperature of the second material is furthermore preferably approximately 100° C. to approximately 140° C.

In a furthermore preferred embodiment of the invention, the first temperature is approximately 10° C. to approximately 20° C. greater than the first glass transition temperature of the first material and the first temperature is furthermore preferably approximately 20° C. to approximately 70° C. greater than the second glass transition temperature of the second material.

It is furthermore preferably the case that the second material is removed after lowering the temperature and, particularly preferably, the separating material is also removed after removing the second material.

A further aspect of the invention is to provide a method for smoothing areas of a structure made of a first material having a predetermined first glass transition temperature on a carrier, including the following steps of:
    applying a thin layer of a second material having a predetermined second glass transition temperature, so that the surface of the structure of the first material is at least partially covered by the second material;
    increasing the temperature of the second material to a first predeterminable temperature, which is greater than the second glass transition temperature of the second material; and
    lowering the temperature below the second glass transition temperature of the second material.

The method according to this aspect of the invention advantageously makes it possible to smooth the surface in the second material on the basis of the surface tension of the second material. In this case, the surface energy of the second material is minimized by the surface tension, the shape of the structure of the first material, for example a parallelepipedal shape of the first material, essentially remaining the same.

In a preferred embodiment of the present invention, the second glass transition temperature of the second material is less than the first glass transition temperature of the first material. What is thereby achieved is that when the temperature is increased, the second material sooner undergoes transition to the glass state than the first material. Consequently, the surface tension may already bring about a minimization of the surface energy, i.e. a smoothing of the surface, before the first material undergoes transition to the glass state.

In a further preferred embodiment, the first temperature is less than the first glass transition temperature of the first material. Accordingly, the second material can reach the glass state as a result of increasing the temperature to the first temperature, but the first material cannot. As a result, the surface and the shape of the first material remain unchanged, whereas a minimum surface of the second material is produced by means of the surface tension. However, since the surface of the second material that faces the first material is connected to the first material, only the surface of the second material that is remote from the first material can be minimized. That is to say that a new structure arises which essentially comprises the structure of the first material with the thin layer of the second material applied thereto, that surface of said new structure which is remote from the first material having a minimum surface energy, i.e. a smoothed surface.

Preferably, the first temperature is approximately 10° C. to approximately 20° C. greater than the second glass transition temperature of the second material.

The first glass transition temperature of the first material is furthermore preferably approximately 110° C. to approximately 150° C. and the second glass transition temperature of the second material is particularly preferably approximately 80° C. to approximately 120° C.

In a further preferred embodiment of the present invention, the layer thickness of the second material is approximately 5 nm to approximately 20 nm.

In the preceding methods of the invention, the first material is preferably aliphatic acrylate and/or methacrylate esters, polyether-modified acrylate/methacrylate esters, fluorine-modified acrylate/methacrylate esters, silane- or siloxane-modified acrylate/methacrylate esters, fluorine-, silane-, siloxane-, alkylether-modified acrylate/methacrylate ester maleic anhydride copolymers. The second material is preferably acrylate/methacrylate adamantyl esters, aromatic polyethers, aromatic polyesters, modified polyhydroxystyrenes, hydroxystyrene acrylate/methacrylate esters, acrylate/methacrylate maleic anhydride copolymers, norbornene maleic anhydride copolymers, polyaryl ether sulfones.

The first and/or second material are/is particularly preferably a photoresist.

In the methods of the invention specified above, the structure of the first material is preferably an essentially parallelepipedal structure.

The carrier furthermore preferably has at least one essentially planar area, the structure of the first material being applied to said planar area.

Particularly preferably, the carrier material is a possibly patterned semiconductor substrate, preferably a patterned semiconductor substrate includes a multiplicity of material layers that are connected to one another or merge with one another, as is the case e.g., in a semiconductor memory chip.

The present invention makes it possible to reduce the edge roughnesses of commercially available photoresists (resists), in particular of highly sensitive fast photoresists, which have greater intrinsic edge roughnesses compared with slower photoresists, so that higher throughput and lower production costs can be achieved when using said faster resists with shorter exposure times.

Since the invention does not commence until on the finished resist structures, it is advantageously possible additionally to utilize all conventional measures for reducing the edge roughness. The methods of the present invention do not exclude these measures, but rather supplement them.

Other features and advantages of the present invention will be apparent from the following detailed description when read in conjunction with the accompanying drawings.

BRIEF DESCRIPTION OF THE DRAWING FIGURES

The foregoing and other features of the present invention will be more readily apparent from the following detailed description and drawings figures of illustrative embodiments of the invention in which.

DETAILED DESCRIPTION OF PREFERRED EMBODIMENTS

A preferred embodiment variant for smoothing areas of a structure made of a first material on a carrier is described below with reference to FIGS. 1a to 1d.

Figure 1A:
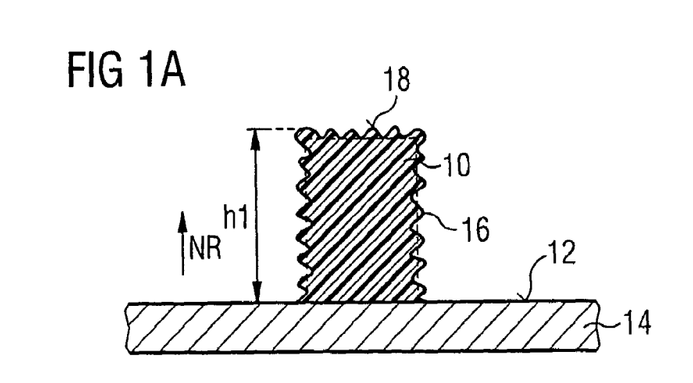
FIGS. 1a to 1d: show sectional views of method stages of one embodiment variant of the method of the present invention for smoothing areas of a structure made of a first material on a carrier.

FIG. 1a shows a sectional view of a first material 10 situated on a preferably planar area or surface 12 of a carrier 14. The first material 10 preferably has an essentially rectangular structure in cross section, which is identified by broken lines. In reality, however, such a structure is achieved only to an approximation since the surface of the first material 10 has an edge roughness 16 due to the dictates of production. An area 18 of the surface of the structure of the first material 10 is essentially plane-parallel to the surface 12. Furthermore, FIG. 1a illustrates a height h1, at which the area 18 of the first material 10 is situated above the essentially planar surface 12 of the carrier 14. In this case, said height h1 represents an average height that fluctuates about the edge roughness 16, the height h1 being measured in a direction NR of the normal to the surface 12 of the carrier 14 or in the area plane of the carrier 14, i.e. essentially perpendicular to said surface 12 of the carrier 14.

Figure 1B:
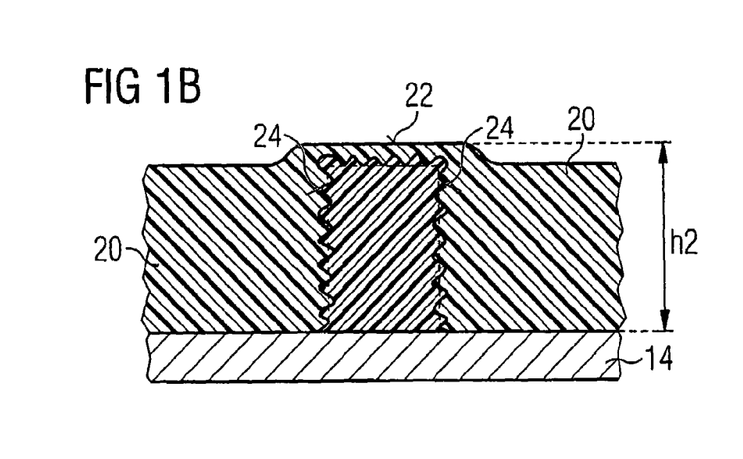

FIG. 1b shows a sectional view after a further method step, during which a second material 20 has been applied. As can be seen from FIG. 1b, the second material 20 completely covers the first material 10 in the sectional plane and an area 22 of the second material 20 runs essentially parallel to the surface 12 of the carrier 14. Furthermore, this figure illustrates the height h2 of the area 22 of the second material 20 above the surface 12 of the carrier 14. In this case, the height h2, in the region of the structure of the first material 10, is measured analogously to the height h1, i.e. perpendicular to the surface 12 of the carrier 14.

Figure 1C:
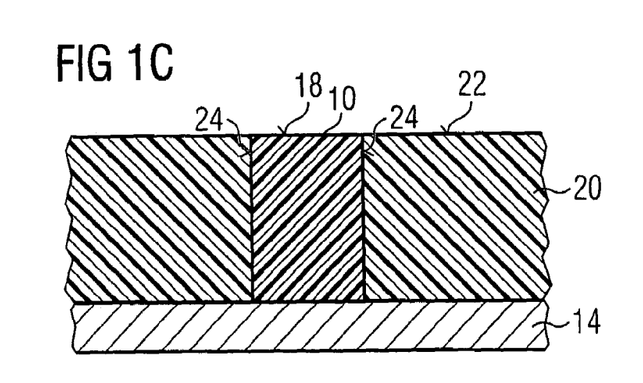

FIG. 1c shows a further sectional view after the temperature in the first material has been increased above a glass transition temperature of the first material and of the second material. On account of the surface tension, the surface is smoothed and the edge roughness is thereby reduced. Since the height h2 of the area 22 of the second material 20 is only slightly greater than the height h1 of the area 18 of the surface of the first material 10, i.e. since the difference between these two heights h1 and h2 is small in comparison with the value of the height h1, the area 18 of the first material 10 is essentially adapted to the area 22 of the second material 20, i.e. the surface energy of said area 18 is minimized independently of the surface energies of the side areas 24. As a consequence, although the area 18 is smoothed, i.e. the edge roughness is reduced, the surface of the first material 10, comprising the area 18 and the side areas 24, is not minimized in its entirety, which would result in a cross-sectionally circular or elliptic structure of the first material 10. Rather, the surface energies of the area 18 and of the side areas 24 are minimized separately from one another, as a result of which the structure of the first material 10, i.e. the rectangular cross section in this case, is essentially preserved.

Figure 1D:
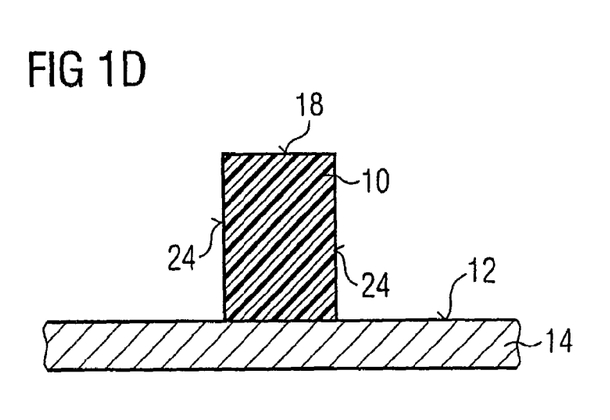

In a next method step, the second material 20 is finally removed. As a result, only the carrier 14 and the structure of the first material 10 are preserved. This is illustrated in FIG. 1d.

A further preferred embodiment variant of the method of the present invention is illustrated with reference to FIGS. 2a to 2e, FIG. 2a illustrating a structure analogously to FIG. 1a.

Figure 2A:
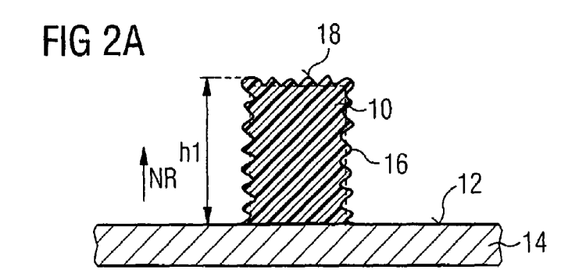
FIGS. 2a to 2e: show sectional views of method stages of a further preferred embodiment variant of the method of the present invention for smoothing areas of a structure made of a first material on a carrier.
Figure 2B:
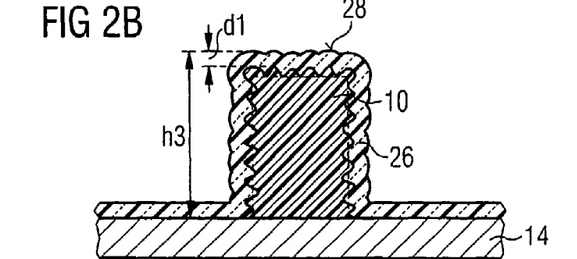

In a further method step, a thin layer of a deformable separating material 26 having a layer thickness d1 is applied to the structure of the first material 10. A sectional view after this method step is illustrated in FIG. 2b. The shape of the structure of the first material 10 is essentially retained by virtue of said thin layer of the separating material 26. In other words, the separating material 26 comprises an area 28 that is essentially parallel to the area 18 of the first material 10. A height h3 of the area 28 of the separating material thus essentially results as a sum of the layer thickness d1 of the separating material 26 and the height h1 of the first material 10. The height h3 is again an average height that varies about the edge roughness of the area 28 of the separating material 26 and the edge roughness 16 of the first material 10.

Figure 2C:
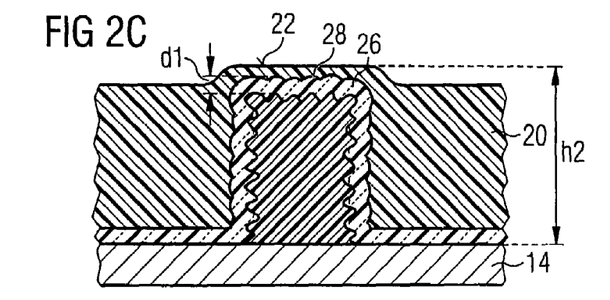

In a next step of this method, a second material 20 is applied, as is illustrated in FIG. 2c.

As can be seen from FIG. 2c, the second material 20 completely covers the first material 10 and the separating material 26 in the sectional plane and an area 22 of the second material 20 runs essentially parallel to the surface 12 of the carrier 14. Furthermore, FIG. 2c illustrates the height h2 of the area 22 of the second material 20 above the surface 12 of the carrier 14. In this case, the height h2, in the region of the structure of the first material 10, is measured analogously to the height h1, i.e. perpendicular to the surface 12 of the carrier 14.

Figure 2D:
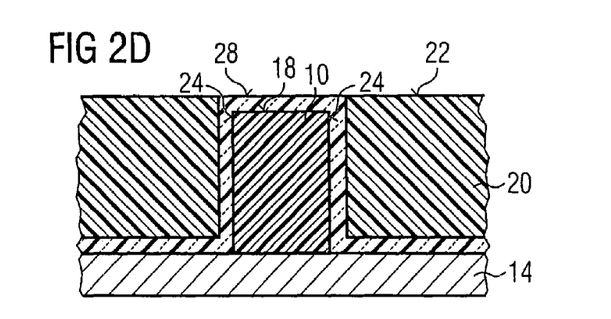

FIG. 2d shows a further sectional view after the temperature in the first material and in the second material has been increased above a glass transition temperature of the first material and above a glass transition temperature of the second material. On account of the surface tension, the surface energies of the surfaces have been minimized, i.e. the surfaces have been smoothed and the edge roughness has been reduced. Since the height h2 of the area 22 of the second material 20 is only slightly greater than the height h3, i.e. since the difference between these two heights is small in comparison with the value of the height h3, the area 18 of the first material 10 and the area 28 of the separating material 26 are essentially adapted to the area 22 of the second material 20, i.e. the surface energy of the area 18 is minimized independently of the surface energies of the side areas 24. As a consequence, although the area 18 is smoothed, the surface of the first material 10, comprising the area 18 and the side areas 24, is not minimized in its entirety, which would result in a cross-sectionally circular or elliptic structure of the first material 10. Rather, the surface energies of the area 18 and of the side areas 24 are minimized separately from one another, as a result of which the structure of the first material 10, i.e. the rectangular cross section in this case, is essentially preserved. Analogously, the corresponding areas of the separating material are also minimized independently of one another.

Figure 2E:
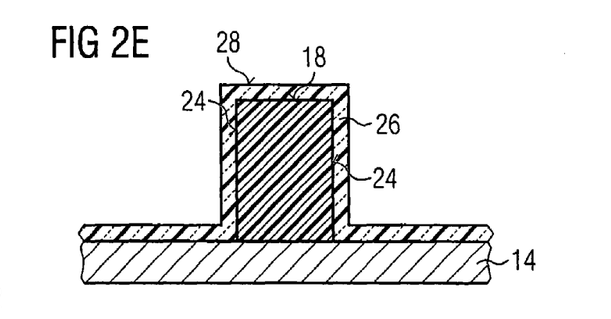

In a next method step, the second material 20 is finally removed. As a result, only the carrier 14 and the structure of the first material 10 with the overlying layer of the separating material 26 are preserved. This is illustrated in FIG. 2e.

A further preferred embodiment variant of the method of the invention is described below with the aid of FIGS. 3a to 3c.

Figure 3A:
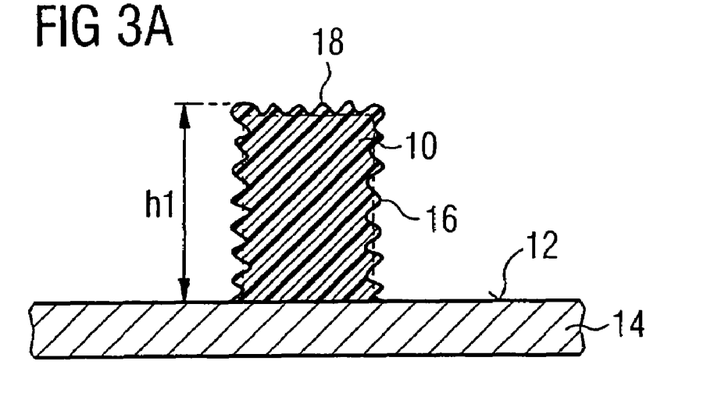
FIGS. 3a to 3c: show sectional views of method stages of a next preferred embodiment variant of the method of the present invention for smoothing areas of a structure made of a first material on a carrier.
Figure 3B:
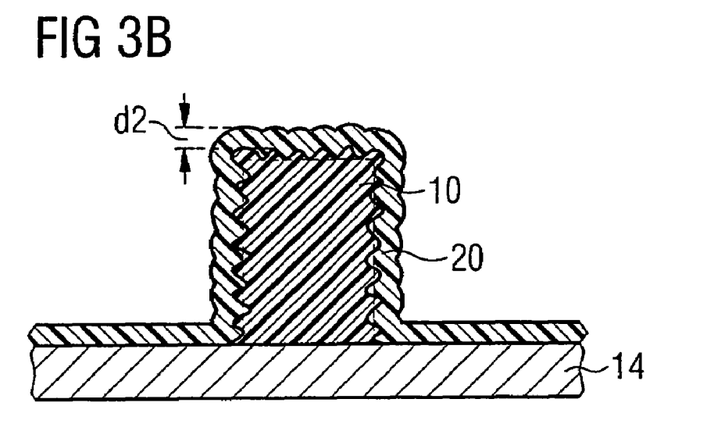

FIG. 3a illustrates a structure analogously to FIG. 1a.

In a further method step, a thin layer of a second material 20 is applied to the first material 10 with a layer thickness d2. A sectional view after this method step has been carried out is shown in FIG. 3b. The layer thickness d2 of the second material 20 is preferably between approximately 5 nm and approximately 20 nm, the structure of the first material 10 being essentially preserved. That is to say that a new structure, comprising the structure of the first material 10 with the thin layer of the second material 20 applied thereon, arises and the shape of said new structure essentially corresponds to the shape of the structure of the first material 10.

Figure 3C:
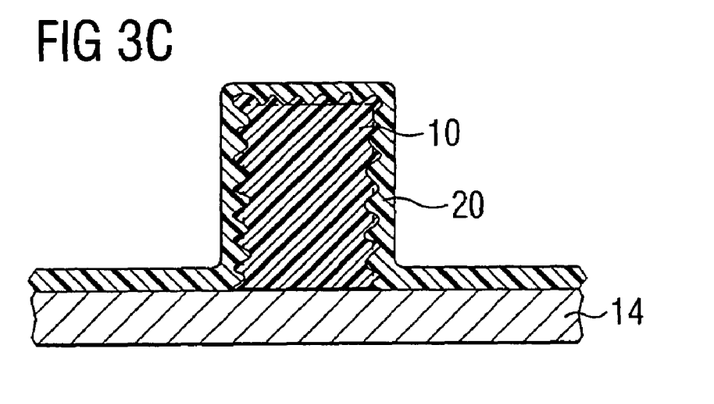

FIG. 3c shows a sectional view after a further method step, the temperature of the second material 20 having been increased to a predetermined temperature above the glass transition temperature of said second material 20. In this case, said predetermined temperature is less than the glass transition temperature of the first material 10. What is thus achieved is that the second material 20 is in the glass state and the surface energy of the second material is minimized on account of surface tension, that is to say that the surface of the second material 20 that is remote from the first material is smoothed. Since the first material 10 has not yet been heated to its glass transition temperature, the structure and also the edge roughness of the first material 10 are preserved. Furthermore, since the second material 20 is connected to the first material 10, the surface of the second material 20 does not assume an essentially circular or elliptic cross section, rather the shape of the structure of the second material 20 is essentially retained, and only the surface is smoothed, i.e. the edge roughness is reduced.

Consequently, the shape of the new structure that arises as a result essentially corresponds to the original structure of the first material 10, said new structure being larger than the original structure of the first material 10 essentially by the layer thickness d2 of the second material 20 and, in addition, the surface of said new structure being smoothed, i.e. the edge roughness being reduced.

The invention is not restricted to structures which have been produced by optical lithography methods. Rather, the methods according to the invention can be employed particularly in the case of arbitrary lithography methods using radiation-sensitive resists. Furthermore, these structures do not have to be produced by lithography methods, but rather may also be produced by other methods for producing structures.

While exemplary drawings and specific embodiments of the present invention have been described and illustrated, it is to be understood that the scope of the present invention is not to be limited to the particular embodiments discussed. Thus, the embodiments shall be regarded as illustrative rather than restrictive, and it should be understood that variations may be made in those embodiments by workers skilled in the art without departing from the scope of the present invention as set forth in the claims that follow, and equivalents thereof. In addition, the features of the different claims set forth below may be combined in various ways in further accordance with the present invention.

The invention claimed is:

1. A method for smoothing areas of a structure made of a first material having a predetermined first glass transition temperature on a carrier, comprising the steps of:
   depositing a second material having a predetermined second glass transition temperature, so that the surface of the structure of the first material is at least partially covered by the second material;
   increasing the temperature of the first material to a first predeterminable temperature, which is greater than the first glass transition temperature; and
   lowering the temperature of the first material below the first glass transition temperature of the first material, wherein the second material remains at least partly on the surface of the structure of the first material.

2. The method as claimed in claim 1, wherein the second material just covers the structure of the first material.

3. The method as claimed in claim 1, wherein the second glass transition temperature of the second material is greater than the first glass transition temperature of the first material.

4. The method as claimed in claim 3, wherein the first temperature is about 10° C. to 20° C. greater than the first glass transition temperature of the first material.

5. The method as claimed in claim 1, wherein the first temperature is less than or equal to the second glass transition temperature of the second material.

6. A method for smoothing areas of a structure made of a first material having a predetermined first glass transition temperature on a carrier, comprising the steps of:
   depositing a thin layer of a deformable separating material to the surface of the first material, so that the surface of the first material is at least partially covered by the separating material;
   applying a second material having a predetermined second glass transition temperature, so that the surface of the separating material is at least partially covered by the second material;
   increasing the temperature of the first material and the second material to a first predeterminable temperature, which is greater than both the first and the second glass transition temperature; and
   lowering the temperature of the first material and the second material below the first glass transition temperature of the first material.

7. The method as claimed in claim 6, wherein the second material just covers the separating material.

8. The method as claimed in claim 6, wherein the separating material is a material selected from the group consisting of aliphatic acrylate and/or methacrylate esters, polyether-modified acrylate/methacrylate esters, fluorine-modified acrylate/methacrylate esters, silane- or siloxane-modified acrylate/methacrylate esters, fluorine-, silane-, siloxane-, alkylether-modified acrylate/methacrylate ester maleic anhydride copolymers, furthermore long-chain siloxane compounds, silicone compounds, wax dispersions, phenolic resins, graphite-containing resins, vapor phase depositable silicon-containing or carbon-containing CVD layers, and sputtering carbon layers.

9. The method as claimed in claim 6, wherein the first material and the second material are identical materials.

10. The method as claimed in claim 6, wherein a layer thickness (d1) of the separating material is between about 5 nm and 20 nm.

11. The method as claimed in claim 6, wherein a layer thickness (d1) of the separating material is between about 8 nm and 12 nm.

12. The method as claimed in claim 6, wherein the second glass transition temperature of the second material is greater than or equal to the first glass transition temperature of the first material.

13. The method as claimed in claim 6, wherein the first temperature is about 10° C. to 20° C. greater than the first glass transition temperature of the first material.

14. The method as claimed in claim 6, wherein the first temperature is about 20° C. to 70° C. greater than the second glass transition temperature of the second material.

15. A method for smoothing areas of a structure made of a first material having a predetermined first glass transition temperature on a carrier, comprising the steps of:
depositing a thin layer of a second material having a predetermined second glass transition temperature, so that the surface of the structure of the first material is at least partially covered by the second material;
increasing the temperature of the second material to a first predeterminable temperature, which is greater than the second glass transition temperature of the second material; and
lowering the temperature below the second glass transition temperature of the second material, wherein the second material remains at least partly on the surface of the structure of the first material.

16. The method as claimed in claim 15, wherein the second glass transition temperature of the second material is less than the first glass transition temperature of the first material.

17. The method as claimed in claim 15, wherein the first temperature is less than the first glass transition temperature of the first material.

18. The method as claimed in claim 15, wherein the first temperature is about 20° C. to 70° C. greater than the second glass transition temperature of the second material.

19. The method as claimed in claim 15, wherein a layer thickness (d2) of the second material is between about 5 nm and 20 nm.

20. The method as claimed in claim 15, wherein the first material is a material selected from the group consisting of aliphatic acrylate and/or methacrylate esters, polyether-modified acrylate/methacrylate esters, fluorine-modified acrylate/methacrylate esters, silane- or siloxane-modified acrylate/methacrylate esters, and fluorine-, silane-, siloxane-, alkylether-modified acrylate/methacrylate ester maleic anhydride copolymers.

21. The method as claimed in claim 15, wherein the second material is a material selected from the group consisting of acrylate/methacrylate adamantyl esters, aromatic polyethers, aromatic polyesters, modified polyhydroxystyrenes, hydroxystyrene acrylate/methacrylate esters, acrylate/methacrylate maleic anhydride copolymers, norbornene maleic anhydride copolymers, and polyaryl ether sulfones.

22. The method as claimed in claim 15, wherein at least one of the first material and the second material is a photoresist.

23. The method as claimed in claim 15, wherein the structure of the first material is substantially a parallelepipedal structure.

24. The method as claimed in claim 15, wherein the carrier has at least one substantially planar area and the structure of the first material is applied to said planar area.

25. The method as claimed in claim 15, wherein the carrier material is a patterned semiconductor structure.

26. The method as claimed in claim 25, wherein the carrier material is a multilayered semiconductor structure.

* * * * *

UNITED STATES PATENT AND TRADEMARK OFFICE
CERTIFICATE OF CORRECTION

PATENT NO. : 7,332,444 B2
APPLICATION NO. : 11/064528
DATED : February 19, 2008
INVENTOR(S) : Wolf-Dieter Domke et al.

Page 1 of 1

It is certified that error appears in the above-identified patent and that said Letters Patent is hereby corrected as shown below:

On the Title Page, under item [56]

Under Other Publications, line 1, "Falbe et al," should read --Falbe et al.,--

At column 1, line 35, "4 nin" should read --4 nm--

Signed and Sealed this

Tenth Day of June, 2008

JON W. DUDAS
*Director of the United States Patent and Trademark Office*